United States Patent
Lee

(10) Patent No.: US 6,819,614 B2
(45) Date of Patent: Nov. 16, 2004

(54) SEMICONDUCTOR MEMORY DEVICE AND SENSING CONTROL METHOD HAVING MORE STABLE INPUT/OUTPUT LINE SENSING CONTROL

(75) Inventor: Jae-goo Lee, Sungnam (KR)

(73) Assignee: Samsung Electronics Co., Ltd., Suwon (KR)

( * ) Notice: Subject to any disclaimer, the term of this patent is extended or adjusted under 35 U.S.C. 154(b) by 153 days.

(21) Appl. No.: 10/309,055

(22) Filed: Dec. 4, 2002

(65) Prior Publication Data

US 2003/0103397 A1 Jun. 5, 2003

(30) Foreign Application Priority Data

Dec. 5, 2001 (KR) .......................................... 2001-76561

(51) Int. Cl.[7] .............................................. G11C 7/02
(52) U.S. Cl. ........................ 365/207; 365/203; 365/196
(58) Field of Search ................................. 365/203, 207, 365/205, 196, 190, 202

(56) References Cited

U.S. PATENT DOCUMENTS

| | | | | |
|---|---|---|---|---|
| 5,428,574 A | * | 6/1995 | Kuo et al. ................... | 365/201 |
| 6,075,736 A | * | 6/2000 | Kim et al. ................... | 365/207 |
| 6,181,618 B1 | * | 1/2001 | Inaba et al. ................. | 365/203 |
| 6,661,714 B2 | * | 12/2003 | Lee ......................... | 365/189.11 |
| 2003/0090950 A1 | * | 5/2003 | Lim et al. ................... | 365/205 |

* cited by examiner

Primary Examiner—Richard Elms
Assistant Examiner—Hien Nguyen
(74) Attorney, Agent, or Firm—Harness Dickey

(57) ABSTRACT

A semiconductor memory device having a more stable input/output (I/O) line sensing control scheme regardless of variation of a threshold voltage and a sensing control method thereof. The semiconductor memory device includes a control circuit that controls a pair of switch transistors which are connected between a pair of I/O lines and a pair of data lines. The control circuit may generate a control signal that turns on one switch transistor while turning off the other switch transistor, and varies the voltage level of the control signal according to variation of the threshold voltage of the switch transistors. As a result, when the threshold voltages of the switch transistors vary according to a manufacturing process, the voltage level of the control signal varies with the variation of the threshold voltages so as to turn on only one switch transistor during a sensing operation, thereby performing a more stable sensing operation.

20 Claims, 4 Drawing Sheets

SEMICONDUCTOR MEMORY DEVICE AND SENSING CONTROL METHOD HAVING MORE STABLE INPUT/OUTPUT LINE SENSING CONTROL

CROSS-REFERENCE TO RELATED APPLICATIONS

The present application hereby claims priority under 35 U.S.C. §119 on Korean patent publication number 01-76561 filed Dec. 5, 2001, the entire contents of which are hereby incorporated by reference.

BACKGROUND OF THE INVENTION

1. Field of the Invention

The present invention relates to a semiconductor memory device and a sensing control method, and more particularly, to input/output (I/O) line sensing control in a semiconductor memory device and a sensing control method.

2. Description of the Related Art

In a semiconductor memory device, data in a memory cell is read out by passing through a pair of I/O lines, for example, an I/O line and a complementary I/O line. In a readout operation, a difference between the voltages of the I/O line and the complementary I/O line may be very small. Conventionally, since it is important to stably sense the small voltage difference, a charge transfer pre-sensing technique (CTPS) may be used for sensing the voltage difference.

FIG. 1 illustrates a data path using a conventional CTPS in a semiconductor memory device.

Referring to FIG. 1, a pair of bit lines BL and BLB are connected to memory cells 111 and 112 in a memory cell array 11 and connected to a bit line sense amplifier 13 by passing through a pair of isolation transistors 121 and 122 that are responsive to an isolation control signal ISO. The bit line sense amplifier 13 is connected to a pair of I/O lines FIO and FIOB by passing through a pair of column selection transistors 141 and 142 that are responsive to a column selection control signal CSL.

A first precharge circuit 15 responsive to a first precharge signal FIOP is connected between the pair of I/O lines FIO and FIOB, and the I/O lines FIO and FIOB are connected to a pair of data lines SIO and SIOB by passing through a pair of switch transistors 161 and 162. Second precharge circuits 171 and 172, responsive to a second precharge signal SIOP, are connected to the data lines SIO and SIOB, and the data lines SIO and SIOB are connected to a data line sense amplifier 18. A control transistor 19 responsive to a sense enable signal SAEN is connected to the data line sense amplifier 18.

In the data path using the conventional CTPS, in order to increase the voltage difference between the data lines SIO and SIOB in the sensing operation, the low level of a control signal IOSW must be determined to turn on one of the switch transistors 161 and 162 while turning off the other one. That is, a voltage Vgs1 between the gate and source of the switch transistor 161 has to be equal to or greater than the threshold voltage Vth of the switch transistor 161, and a voltage Vgs2 between the gate and source of the switch transistor 162 has to be smaller than the threshold voltage Vth of the switch transistor 162.

In the opposite case, the voltage Vgs1 between the gate and source of the switch transistor 161 has to be smaller than the threshold voltage Vth of the switch transistor 161, and the voltage Vgs2 between the gate and source of the switch transistor 162 has to be equal to or greater than the threshold voltage Vth of the switch transistor 162.

In the prior art, the low level of the control signal IOSW is generated with a predetermined value in the sensing operation. Consequently, when the threshold voltages Vth of the switch transistors 161 and 162 are varied according to a manufacturing process, the switch transistors 161 and 162 may be simultaneously turned on or off, thereby causing misoperation.

SUMMARY OF THE INVENTION

The present invention provides a semiconductor memory device having a more stable input/output (I/O) line sensing technique less dependent on variations of a threshold voltage.

The present invention also provides a sensing control method for more stably performing a sensing operation, less dependent on variations of a threshold voltage.

In an exemplary embodiment, the present invention is directed to a semiconductor memory device that includes a control circuit for controlling a pair of switch transistors connected between a pair of I/O lines and a pair of data lines. The control circuit generates a control signal that turns on one switch transistor while turning off the other switch transistor, and varies the voltage level of the control signal according to variation of the threshold voltage of the switch transistors.

A pair of input/output (I/O) lines transfer a pair of differential signals that are read out from the memory cell array. A first precharge circuit precharges the pair of I/O lines to a first level in response to a first precharge signal and a second precharge circuit precharges the pair of data lines to a second level in response to a second precharge signal. A sense amplifier senses and amplifies the voltages of the pair of data lines.

In another exemplary embodiment, the switch transistors are PMOS transistors, the first level is a power supply voltage level, and the second level is the ground voltage level. In another exemplary embodiment, the control circuit includes a first PMOS transistor in which the power supply voltage is applied to the source, the input signal is applied to the gate, and the control signal is output from the drain, a second PMOS transistor in which the power supply voltage is applied to the source, and the drain of the first PMOS transistor is connected to the gate and drain, an inverter for inverting the input signal, a delay circuit for delaying the output signal of the inverter, a first NMOS transistor in which the drain of the first PMOS transistor is connected to the drain and the output signal of the delay circuit is applied to the gate, and a second PMOS transistor in which the source of the first NMOS transistor is connected to the drain, the input signal is applied to the gate, and the ground voltage is applied to the source.

In another exemplary embodiment, the switch transistors are NMOS transistors, the first level is the ground voltage level, and the second level is the power supply voltage level. In another exemplary embodiment, the control circuit includes a first PMOS transistor in which the power supply voltage is applied to the source and the input signal is applied to the gate, an inverter for inverting the input signal, a delay circuit for delaying the output signal of the inverter, a second PMOS transistor in which the drain of the first PMOS transistor is connected to the source, the output signal of the delay circuit is applied to the gate, and the control signal is output from the drain, a first NMOS transistor in which the drain of the second PMOS transistor is connected to the drain, the input signal is applied to the gate, and the ground voltage is applied to the source, and a second NMOS transistor in which the drain of the second PMOS transistor is connected to the drain and gate, and the ground voltage is applied to the source.

A sensing control method for a semiconductor memory device including a pair of switch transistors connected between a pair of I/O lines and a pair of data lines, the sensing control method comprising generating a control signal having a voltage level which varies according to a variation of the threshold voltage of the pair of switch transistors turning on one of the pair of switch transistors while turning off the other of the pair of switch transistors according to the control signal and sensing a pair of differential signals on the pair of data lines.

In another exemplary embodiment, the present invention is directed to a sensing control method for a semiconductor memory device including a memory cell array, a pair of I/O lines for transferring a pair of differential signals that are read out from the memory cell array, a pair of switch transistors having one electrodes connected to the I/O lines, and a pair of data lines connected to the other electrodes of the switch transistors, where the sensing control method includes precharging the I/O lines to a first level in response to a first precharge signal, precharging the data lines to a second level in response to a second precharge signal, generating a control signal having a voltage level which varies according to variation of the threshold voltage of the switch transistors, turning on one switch transistor while turning off the other switch transistor according to the control signal, and sensing the pair of differential signals on the pair of data lines.

In another exemplary embodiment, the first level is a power supply voltage level in the case that the switch transistors are PMOS transistors. In another exemplary embodiment, generating the control signal includes adjusting the voltage level of the control signal to the power supply voltage level according to the logic low level of the input signal, and adjusting the voltage level of the control signal to a value obtained by subtracting the threshold voltage of the PMOS transistor from the power supply voltage according to the logic high level of the input signal.

In another exemplary embodiment, the first level is the ground voltage level in the case that the switch transistors are NMOS transistors and the second level is the power supply voltage level. In another exemplary embodiment, generating the control signal includes adjusting the voltage level of the control signal to the ground voltage level according to the logic high level of the input signal, and adjusting the voltage level of the control signal to a value obtained by adding the threshold voltage of the NMOS transistor to the ground voltage according to the logic low level of the input signal.

BRIEF DESCRIPTION OF THE DRAWINGS

The present invention will become more apparent by describing in detail exemplary embodiments thereof with reference to the attached drawings in which.

DETAILED DESCRIPTION OF EXEMPLARY EMBODIMENTS OF THE INVENTION

Figure 2:
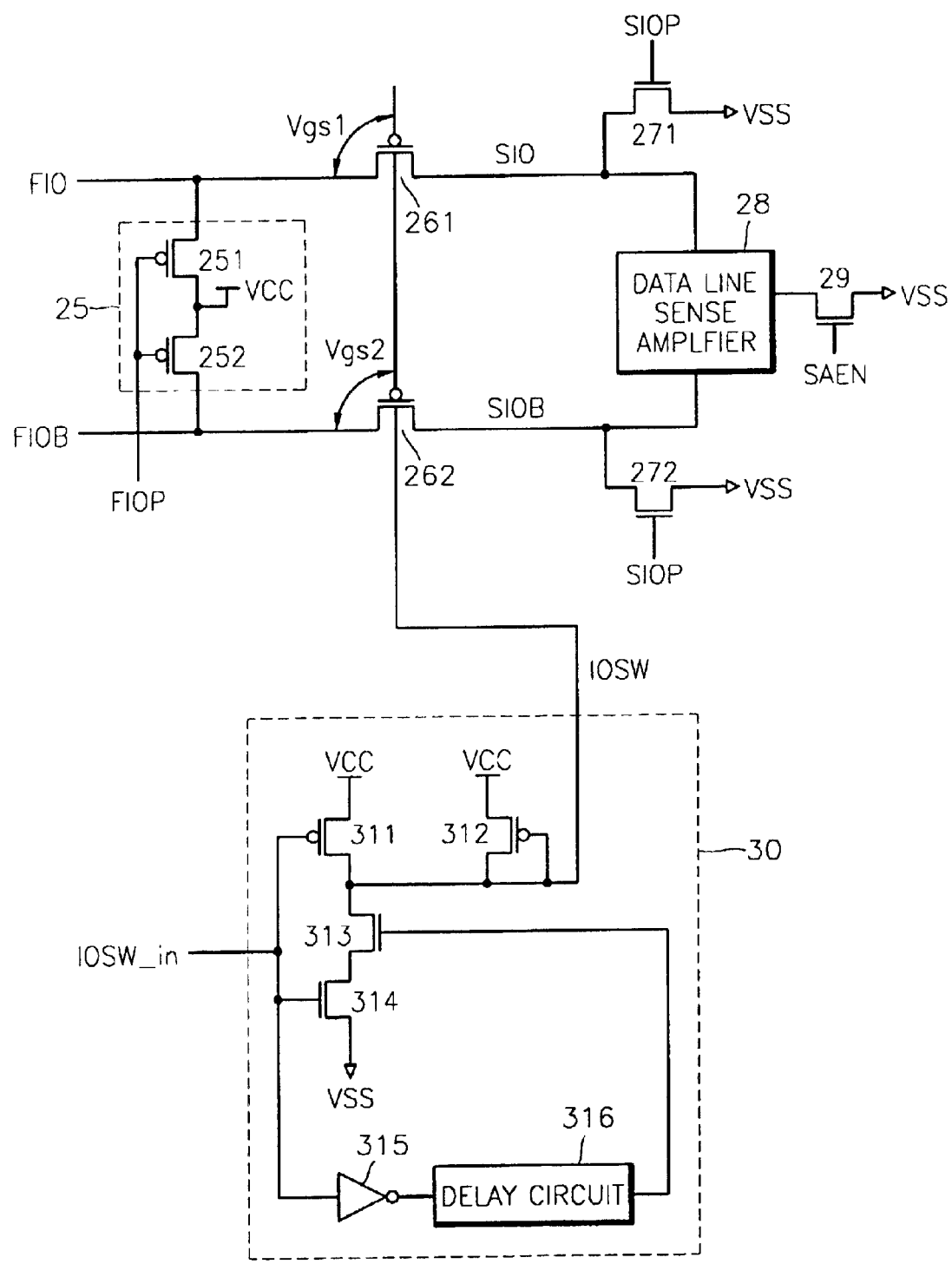
FIG. 2 is a diagram illustrating a portion of a data path in a semiconductor memory device according to an exemplary embodiment of the present invention.

FIG. 2 is a diagram illustrating a portion of a data path in a semiconductor memory device according to an exemplary embodiment of the present invention.

Referring to FIG. 2, the semiconductor memory device according to an exemplary embodiment of the present invention includes a pair of input/output (I/O) lines FIO and FIOB, a first precharge circuit 25 formed of PMOS transistors, a pair of switch transistors 261 and 262 formed of the PMOS transistors, a pair of data lines SIO and SIOB, second precharge circuits 271 and 272 formed of NMOS transistors, a data line sense amplifier 28, a control transistor 29 formed of a NMOS transistor, and a control circuit 30.

Figure 1:
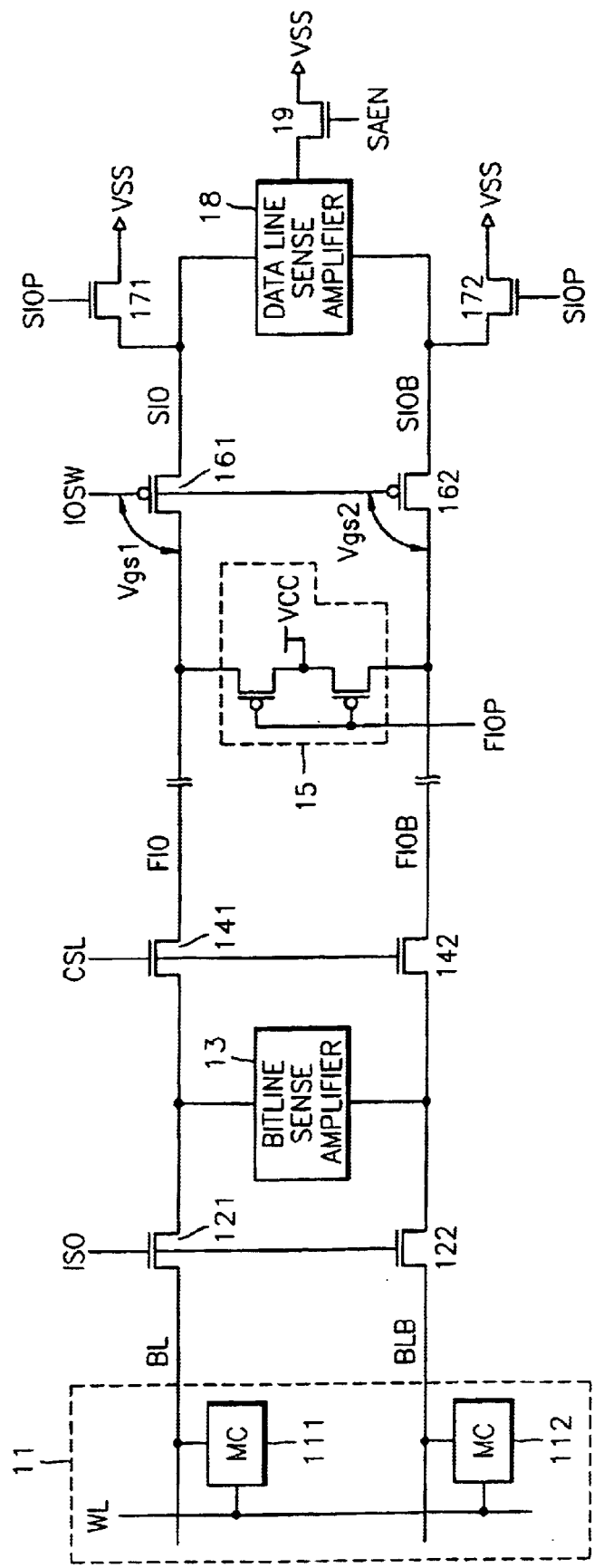
FIG. 1 is a diagram illustrating a data path using a charge transfer pre-sensing scheme (CTPS) in a conventional semiconductor memory device.

In a readout operation, as shown in FIG. 1, the I/O lines FIO and FIOB transfer a pair of differential signals that are read out from a memory cell array 11 by passing through bit lines BL and BLB, isolation transistors 121 and 122, a bit line sense amplifier 13, and column selection transistors 141 and 142. The first precharge circuit 25 precharges the I/O lines FIO and FIOB into a power supply voltage VCC level in response to a first precharge signal FIOP.

One electrode of the switch transistor 261 and one electrode of the switch transistor 262 are connected to the pair of I/O lines FIO and FIOB, and the other electrodes to the pair of data lines SIO and SIOB. The second precharge circuits 271 and 272 precharge the data lines SIO and SIOB to the ground voltage VSS level in response to a second precharge signal SIOP. When the control transistor 29 is turned on by an enable signal SAEN, the data line sense amplifier 28 senses and amplifies the voltages of the data lines SIO and SIOB.

To increase the voltage difference between the input terminations of the data line sense amplifier 28, namely the data lines SIO and SIOB, in the sensing operation, the control circuit 30 generates a control signal IOSW to turn on one of the switch transistors 261 and 262 while turning off the other switch transistor. Additionally, the control circuit 30 varies the voltage level of the control signal IOSW according to variation of the threshold voltages of the switch transistors 261 and 262.

Particularly, when input signal OSW_in is low, which means that the sensing operation has not started yet, the control circuit 30 adjusts the voltage level of the control signal IOSW to the power supply voltage VCC level, thereby turning off the switch transistors 261 and 262.

When the input signal IOSW_in is high, i.e., in the sensing operation, the control circuit 30 adjusts the voltage level of the control signal IOSW to a value obtained by subtracting the threshold voltages of the switch transistors 261 and 262 from the power supply voltage VCC. Consequently, the voltage level of the control signal IOSW varies according to variation of the threshold voltages of the switch transistors 261 and 262. Accordingly, when the threshold voltages of the switch transistors 261 and 262 vary according to a manufacturing process, the voltage level of the control signal IOSW varies with the variation of the threshold voltages so as to turn on only one switch transistor in the sensing operation. Therefore, the voltage difference between the input terminations of the data line sense amplifier 28, namely the data lines SIO and SIOB, becomes sufficiently great to perform a more stable sensing operation.

Figure 3:
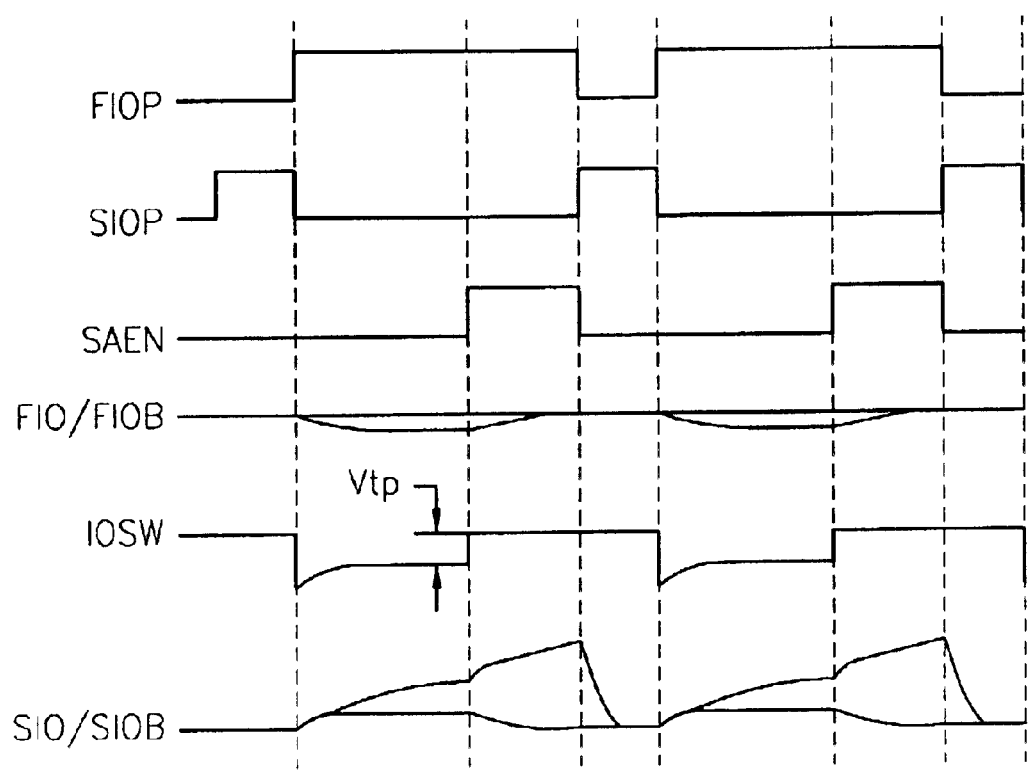
FIG. 3 illustrates waveforms of signals related to a sensing operation of the circuit shown in FIG. 2.

The sensing operation will be further described referring to waveforms shown in FIG. 3.

The control circuit 30 includes a first PMOS transistor 311, a second PMOS transistor 312, a first NMOS transistor 313, a second NMOS transistor 314, an inverter 315, and a delay circuit 316.

In the first PMOS transistor 311, the power supply voltage VCC is applied to the source, the input signal IOSW_in is applied to the gate, and the control signal IOSW is output from the drain. In the second PMOS transistor 312, the power supply voltage VCC is applied to the source, and the gate and drain are connected to the drain of the first PMOS transistor 311. In this case, the second PMOS transistor 312 has the same or substantially the same threshold voltage as the switch transistors 261 and 262.

The inverter 315 inverts the input signal IOSW_in, and the delay circuit 316 delays an output signal of the inverter 315. In the first NMOS transistor 313, the drain of the first PMOS transistor 311 is connected to the drain, and the output signal of the delay circuit 316 is applied to the gate. In the second NMOS transistor 314, the source of the first NMOS transistor 313 is connected to the drain, the input signal IOSW_in is applied to the gate, and the ground voltage VSS is applied to the source.

FIG. 3 illustrates the waveforms of signals related to the sensing operation in the circuit shown in FIG. 2. Referring to FIG. 3, the sensing operation in the circuit shown in FIG. 2 will now be described in detail.

When the input signal IOSW_in is low, which means that the sensing operation has not started yet, the first PMOS transistor 311 of the control circuit 30 is turned on for adjusting the voltage level of the control signal IOSW to the power supply voltage level VCC. Accordingly, the switch transistors 261 and 262 are turned off. In this case, the first precharge signal FIOP becomes low while the second precharge signal SIOP becomes high. Consequently, the I/O lines FIO and FIOB are precharged to the power supply voltage VCC level by the first precharge circuit 25 while the data lines SIO and SIOB are precharged to the ground voltage VSS level by the second precharge circuits 271 and 272.

When the input signal IOSW_in is changed from low to high, which means that the sensing operation has started, the first and second NMOS transistors 313 and 314 are turned on together during the delay time of the delay circuit 316 for adjusting the voltage level of the control signal IOSW to the ground voltage VSS level. Then, the first PMOS transistor 311 and the first NMOS transistor 313 are turned off for adjusting the voltage level of the control signal IOSW to a value obtained by subtracting the threshold voltage of the second PMOS transistor 312 from the power supply voltage VCC.

Since the threshold voltage of the second PMOS transistor 312 is the same as those of the switch transistors 261 and 262, the voltage level of the control signal IOSW varies according to variation of the threshold voltage of the second PMOS transistor 312, namely the threshold voltages of the switch transistors 261 and 262.

When the input signal IOSW_in is changed from low to high, which means that the sensing operation has started, the first precharge signal FIOP becomes high while the second precharge signal SIOP becomes low. Accordingly, the first and second precharge circuits 271 and 272 are inactivated.

Consequently, if the power supply voltage VCC level is 2.5 V and the threshold voltage of the second PMOS transistor 312, namely the threshold voltage of the switch transistors 261 and 262 is 0.5 V, the voltage level of the control signal IOSW becomes 2.0 V. If the voltage levels of the signals input through the I/O line FIO and the complementary line FIOB are respectively 2.5 V and 2.3 V, the absolute values of the voltages Vgs1 and Vgs2 between the gates and sources of the switch transistors 261 and 262 are respectively 0.5 V and 0.3 V.

Accordingly, the switch transistor 261 is turned on while turning off the switch transistor 262. Consequently, the charge of the I/O line FIO is transferred to the data line SIO through the turn-on switch transistor 261, so that the voltage level of the data line SIO is more increased comparing to the voltage level of the complementary data line SIOB. As a result, the voltage difference between the data lines SIO and SIOB increases. When the enable signal SAEN becomes high, the control transistor 29 is turned on, so that the data line sense amplifier 28 senses and amplifies the voltage difference between the data lines SIO and SIOB. The described sensing scheme is referred to as charge transfer pre-sensing scheme (CTPS).

Figure 4:
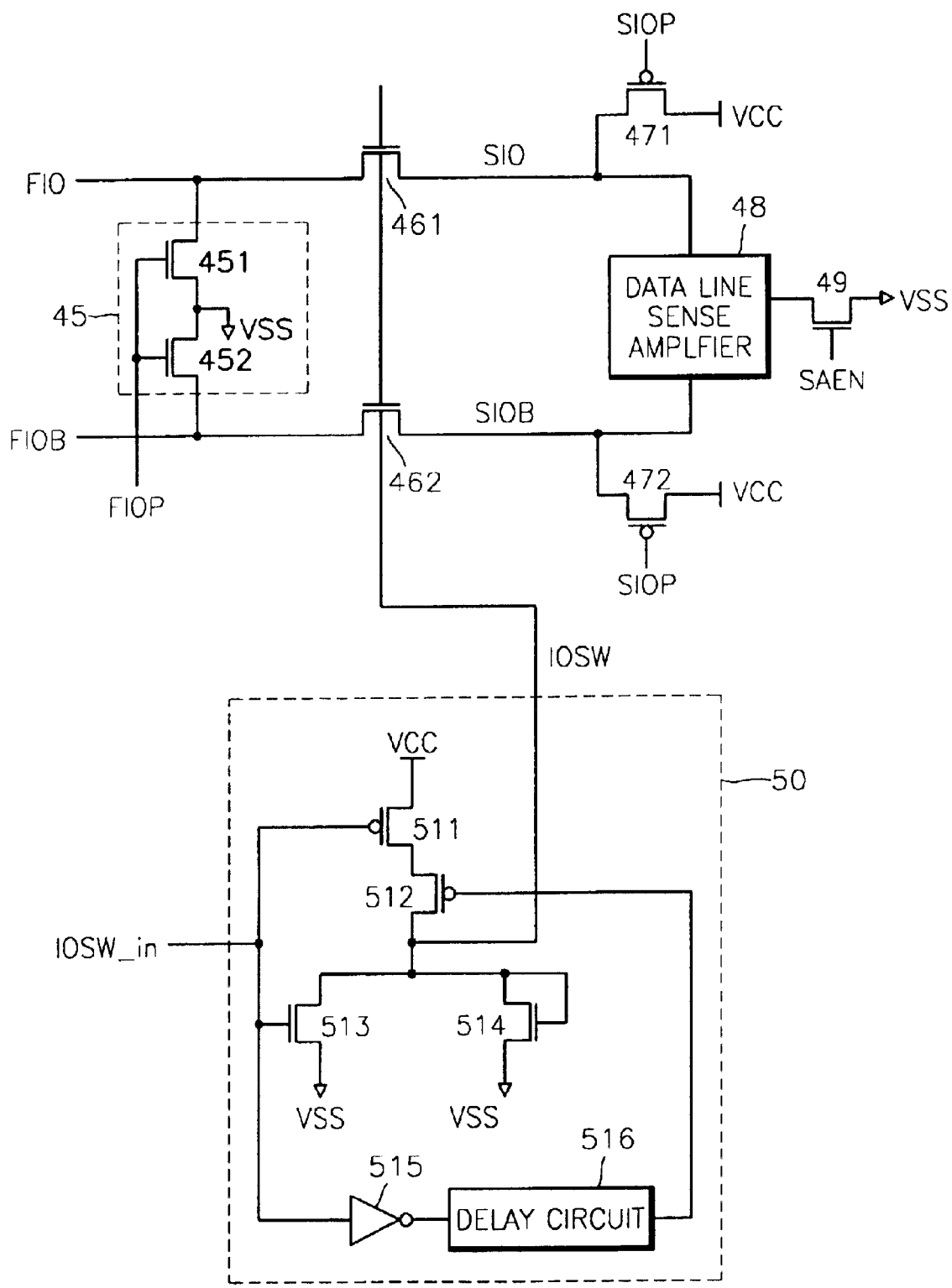
FIG. 4 is a diagram illustrating a portion of a data path in a semiconductor memory device according to another exemplary embodiment of the present invention.

FIG. 4 is a diagram illustrating a portion of a data path in a semiconductor memory device according to another exemplary embodiment of the present invention.

Referring to FIG. 4, the semiconductor memory device according to another exemplary embodiment of the present invention includes a pair of I/O lines FIO and FIOB, a first precharge circuit 45 formed of NMOS transistors, a pair of switch transistors 461 and 462 formed of NMOS transistors, a pair of data lines SIO and SIOB, second precharge circuits 471 and 472 formed of PMOS transistors, a data line sense amplifier 48, a control transistor 49 formed of NMOS transistors, and a control circuit 50.

The first precharge circuit 45 precharges the I/O lines FIO and FIOB to the ground voltage VSS level in response to a first precharge signal FIOP. The second precharge circuits 471 and 472 precharge the data lines SIO and SIOB to a power supply voltage VCC level in response to a second precharge signal SIOP.

The control circuit 50 includes a first PMOS transistor 511, a second PMOS transistor 512, a first NMOS transistor 513, a second NMOS transistor 514, an inverter 515, and a delay circuit 516.

In the first PMOS transistor 511, the power supply voltage VCC is applied to the source and an input signal IOSW_in is applied to the gate. In the second PMOS transistor 512, the drain of the first PMOS transistor 511 is connected to the source, the output signal of the delay circuit 516 is applied to the gate, and a control signal IOSW is output from the drain. In the first NMOS transistor 513, the drain of the second PMOS transistor 512 is connected to the drain and the input signal IOSW_in is applied to the gate. In the second NMOS transistor 514, the drain of the first NMOS transistor 513 is connected to the drain and gate, and the ground voltage VSS is applied to the source.

In this case, the second NMOS transistor 514 has the same or substantially the same threshold voltage as the switch transistors 461 and 462. The inverter 515 inverts the input signal IOSW_in, and the delay circuit 516 delays an output signal of the inverter 515.

When the input signal IOSW_in is high, which means that the sensing operation has not started yet, the first NMOS transistor 513 of the control circuit 50 is turned on for adjusting the voltage level of the control signal IOSW to the ground voltage VSS level. Accordingly, the switch transistors 461 and 462 are turned off.

When the input signal IOSW_in is changed from high to low, which means that the sensing operation has started, the first and second PMOS transistors 511 and 512 are turned on together during the delay time of the delay circuit 516 for adjusting the voltage level of the control signal IOSW into the power supply voltage VCC level. Then, the second PMOS transistor 512 and the first NMOS transistor 513 are turned off for adjusting the voltage level of the control signal IOSW to a value obtained by adding the threshold voltage of the second NMOS transistor 514 to the ground voltage VSS.

Since the threshold voltage of the second NMOS transistor 514 is the same as those of the switch transistors 461 and 462, the voltage level of the control signal IOSW varies according to the threshold voltage of the second NMOS transistor 514, namely the threshold voltage of the switch transistors 461 and 462. Accordingly, in the case that the threshold voltages of the switch transistors 461 and 462 vary according to a manufacturing process, the voltage level of the control signal IOSW varies with the variation of the threshold voltages so as to turn on only one switch transistor in the sensing operation. Therefore, the voltage difference between the input terminations of the data line sense amplifier 48, namely the data lines SIO and SIOB, is sufficiently increased to perform a stable sensing operation.

The sensing operation in the circuit shown in FIG. 4 is similar to the sensing operation in the circuit shown in FIG. 2, therefore description of the sensing operation is omitted.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A semiconductor memory device comprising:
   a memory cell array;
   a pair of input/output (I/O) lines for transferring a pair of differential signals that are read out from the memory cell array;
   a first precharge circuit for precharging the pair of I/O lines into a first level in response to a first precharge signal;
   a pair of switch transistors having one electrode for each of the switch transistors connected to the pair of I/O lines;
   a pair of data lines connected to the other electrodes of the pair of switch transistors;
   a second precharge circuit for precharging the pair of data lines into a second level in response to a second precharge signal;
   a sense amplifier for sensing and amplifying the voltages of the pair of data lines; and
   a control circuit for generating a control signal that turns on one of the pair of switch transistors while turning off the other switch transistors, and for varying the voltage level of the control signal according to variation of the threshold voltage of the pair of switch transistors.

2. The semiconductor memory device of claim 1, wherein the pair of switch transistors are PMOS transistors.

3. The semiconductor memory device of claim 2, wherein the first level is a power supply voltage level.

4. The semiconductor memory device of claim 2, wherein the second level is the ground voltage level.

5. The semiconductor memory device of claim 4, wherein the control circuit adjusts the voltage level of the control signal into the power supply voltage level according to the logic low level of the input signal, and adjusts the voltage level of the control signal to a value obtained by subtracting the threshold voltage of the PMOS transistor from the power supply voltage according to the logic high level of the input signal.

6. The semiconductor memory device of claim 4, wherein the control circuit includes:
   a first PMOS transistor in which the power supply voltage is applied to the source, the input signal is applied to the gate, and the control signal is output from the drain;
   a second PMOS transistor in which the power supply voltage is applied to the source, and the drain of the first PMOS transistor is connected to the gate and drain;
   an inverter for inverting the input signal;
   a delay circuit for delaying the output signal of the inverter;
   a first NMOS transistor in which the drain of the first PMOS transistor is connected to the drain and the output signal of the delay circuit is applied to the gate; and
   a second PMOS transistor in which the source of the first NMOS transistor is connected to the drain, the input signal is applied to the gate, and the ground voltage is applied to the source.

7. The semiconductor memory device of claim 1, wherein the pair of switch transistors are NMOS transistors.

8. The semiconductor memory device of claim 7, wherein the first level is the ground voltage level.

9. The semiconductor memory device of claim 7, wherein the second level is the power supply voltage level.

10. The semiconductor memory device of claim 9, wherein the control circuit adjusts the voltage level of the control signal into the ground voltage level according to the logic high level of the input signal, and adjusts the voltage level of the control signal to a value of adding the threshold voltage of the NMOS transistor to the ground voltage according to the logic low level of the input signal.

11. The semiconductor memory device of claim 9, wherein the control circuit includes:
   a first PMOS transistor in which the power supply voltage is applied to the source, and the input signal is applied to the gate;
   an inverter for inverting the input signal;
   a delay circuit for delaying the output signal of the inverter;
   a second PMOS transistor in which the drain of the first PMOS transistor is connected to the source, the output signal of the delay circuit is applied to the gate, and the control signal is output from the drain;
   a first NMOS transistor in which the drain of the second PMOS transistor is connected to the drain, the input signal is applied to the gate, and the ground voltage is applied to the source; and
   a second NMOS transistor in which the drain of the second PMOS transistor is connected to the drain and gate, and the ground voltage is applied to the source.

12. A sensing control method for a semiconductor memory device including a memory cell array, a pair of I/O lines for transferring a pair of differential signals that are read out from the memory cell array, a pair of switch transistors having one electrodes connected to the I/O lines, and a pair of data lines connected to the other electrodes of the switch transistors, the sensing control method comprising:
   precharging the I/O lines to a first level in response to a first precharge signal;

precharging the data lines to a second level in response to a second precharge signal;

generating a control signal having a voltage level which varies according to variation of the threshold voltage of the pair of switch transistors;

turning on one of the pair of switch transistors while turning off the other of the pair of switch transistors according to the control signal; and sensing the pair of differential signals of the pair of data lines.

13. The sensing control method of claim 12, wherein the first level is a power supply voltage level when the pair of switch transistors are PMOS transistors.

14. The sensing control method of claim 13, wherein the second level is the ground voltage level.

15. The sensing control method of claim 14, wherein generating the control signal includes:

adjusting the voltage level of the control signal to the power supply voltage level according to the logic low level of the input signal; and adjusting the voltage level of the control signal to a value obtained by subtracting the threshold voltage of the PMOS transistor from the power supply voltage according to the logic high level of the input signal.

16. The sensing control method of claim 12, wherein the first level is the ground voltage level when the pair of switch transistors are NMOS transistors.

17. The sensing control method of claim 16, wherein the second level is the power supply voltage level.

18. The sensing control method of claim 17, wherein generating the control signal includes:

adjusting the voltage level of the control signal into the ground voltage level according to the logic high level of the input signal; and adjusting the voltage level of the control signal to a value obtained by adding the threshold voltage of the NMOS transistor to the ground voltage according to the logic low level of the input signal.

19. A semiconductor memory device comprising:

a pair of switch transistors connected between a pair of I/O lines and a pair of data lines; and a control circuit for generating a control signal that turns on one of the pair of switch transistors while turning off the other switch transistors by varying a voltage level of the control signal according to a variation of the threshold voltage of the pair of switch transistors.

20. A sensing control method for a semiconductor memory device including a pair of switch transistors connected between a pair of I/O lines and a pair of data lines, the sensing control method comprising:

generating a control signal having a voltage level which varies according to a variation of the threshold voltage of the pair of switch transistors;

turning on one of the pair of switch transistors while turning off the other of the pair of switch transistors according to the control signal; and sensing a pair of differential signals on the pair of data lines.

* * * * *